United States Patent
Osaga et al.

(10) Patent No.: US 11,069,769 B2
(45) Date of Patent: Jul. 20, 2021

(54) SEMICONDUCTOR DEVICE

(71) Applicant: Mitsubishi Electric Corporation, Tokyo (JP)

(72) Inventors: Tsuyoshi Osaga, Tokyo (JP); Yasuo Ata, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/619,430

(22) PCT Filed: Sep. 7, 2017

(86) PCT No.: PCT/JP2017/032213
§ 371 (c)(1),
(2) Date: Dec. 4, 2019

(87) PCT Pub. No.: WO2019/049251
PCT Pub. Date: Mar. 14, 2019

(65) Prior Publication Data
US 2020/0373382 A1    Nov. 26, 2020

(51) Int. Cl.
*H01L 29/06* (2006.01)
*H01L 27/088* (2006.01)
*H01L 29/739* (2006.01)

(52) U.S. Cl.
CPC ........ *H01L 29/0607* (2013.01); *H01L 27/088* (2013.01); *H01L 29/7395* (2013.01); *H01L 29/7397* (2013.01)

(58) Field of Classification Search
CPC ............. H01L 29/0607; H01L 29/7397; H01L 27/088; H01L 29/7395
USPC ........................................................ 257/139
See application file for complete search history.

(56) References Cited

U.S. PATENT DOCUMENTS

| | | | | |
|---|---|---|---|---|
| 5,569,941 A | * | 10/1996 | Takahashi | H01L 29/0834 257/132 |
| 5,751,023 A | * | 5/1998 | Aono | H01L 29/7397 257/138 |
| 8,507,352 B2 | * | 8/2013 | Koyama | H01L 27/0664 438/328 |

FOREIGN PATENT DOCUMENTS

| JP | H09-307104 A | 11/1997 |
|---|---|---|
| JP | 2006-173297 A | 6/2006 |

OTHER PUBLICATIONS

International Search Report issued in PCT/JP2017/032213; dated Nov. 14, 2017.

(Continued)

*Primary Examiner* — Vu A Vu
(74) *Attorney, Agent, or Firm* — Studebaker & Brackett PC

(57) ABSTRACT

A semiconductor device includes, on an upper surface side of an $N^-$-type drift layer, a P-type well layer, an N-type emitter layer, a gate insulation film, and a gate electrode, and includes, on a lower surface side of the $N^-$-type drift layer, an N-type buffer layer, a P-type collector layer, and an $N^{++}$-type layer. The $N^{++}$-type layer is partially formed in the N-type buffer layer. The $N^{++}$-type layer has impurity concentration being higher than impurity concentration of the N-type buffer layer and being equal to or higher than impurity concentration of the P-type collector layer.

3 Claims, 4 Drawing Sheets

(56) References Cited

OTHER PUBLICATIONS

An Office Action mailed by the Japanese Patent Office dated Apr. 21, 2020, which corresponds to Japanese Patent Application No. 2019-540192 and is related to U.S. Appl. No. 16/619,430.

* cited by examiner

F I G. 5
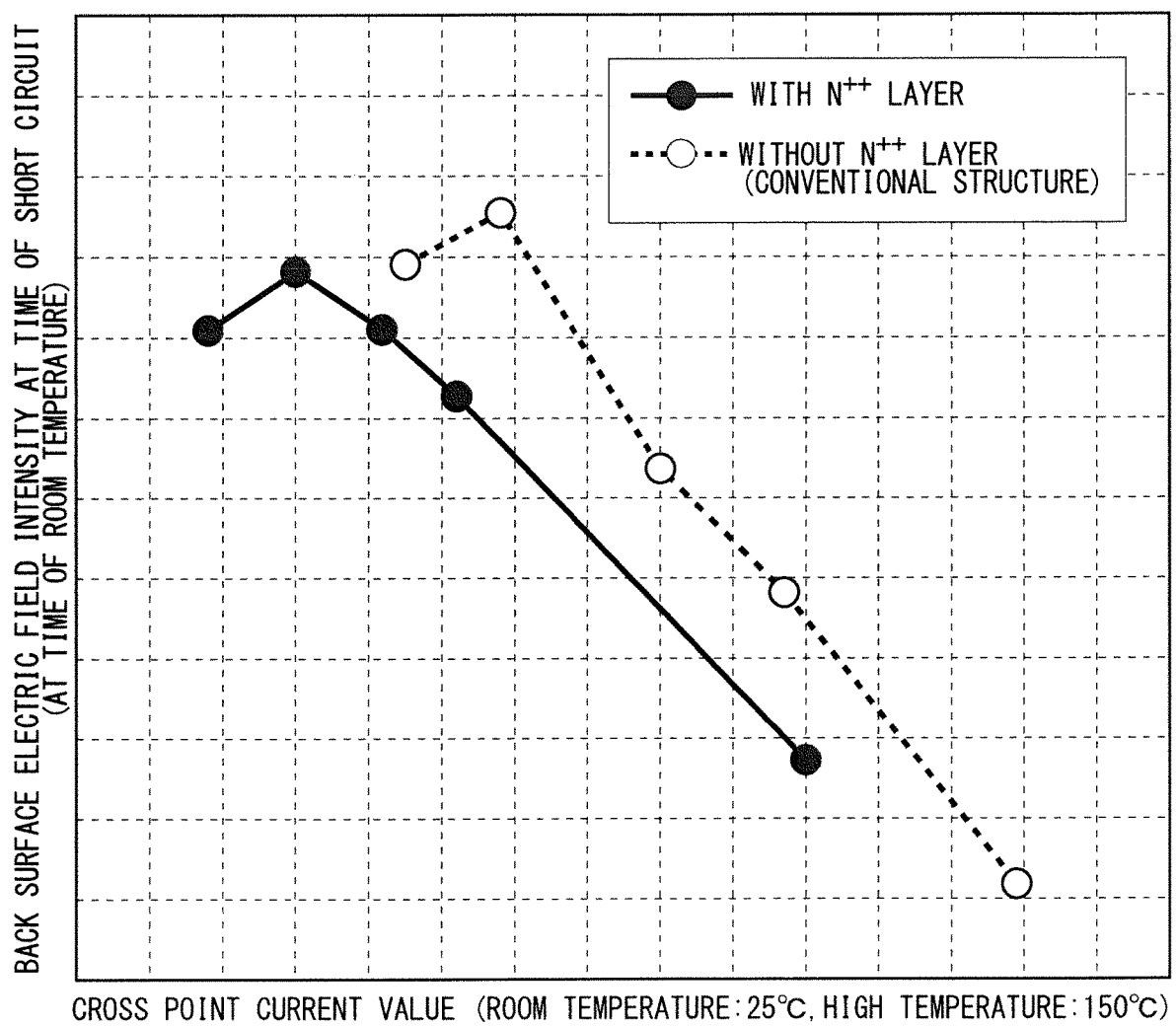

SEMICONDUCTOR DEVICE

TECHNICAL FIELD

The present invention relates to a semiconductor device, and more particularly to a light punch through insulated gate bipolar transistor (IGBT).

BACKGROUND ART

As a semiconductor device used for a power converter such as an inverter, an IGBT has been widely used. In recent years, there has been an increasing demanded for higher capacity and higher current density of a power converter, and improvements for element structures of an IGBT have been made. For example, Patent Document 1 below discloses a structure in which an $N^{++}$-type region having higher impurity concentration than an N-type buffer layer is formed in a boundary portion between a P-type collector layer and the N-type buffer layer of an IGBT. This structure can reduce power losses at the time of switching operation of the IGBT.

PRIOR ART DOCUMENTS

Patent Documents

Patent Document 1: Japanese Patent Application Laid-Open No. 9-307104 (1997)

SUMMARY

Problem to be Solved by the Invention

Generally, to widen the range of a rated current of an inverter, a plurality of IGBT elements are connected in parallel. In such a case, if on voltages of the IGBT elements vary, currents to flow through the IGBTs vary. This may cause currents to concentrate on a specific IGBT element, and the IGBT element may be broken down. Therefore, it is necessary that a plurality of IGBT elements connected in parallel have small variation in characteristics.

Particularly, if a plurality of IGBT elements connected in parallel have such characteristics that on voltages reduce as the temperature rises (i.e., the on voltage has a negative temperature coefficient), current concentration is liable to occur when temperatures of the IGBT elements vary. This has been an obstacle to achieving higher capacity of an inverter.

When the on voltage of the IGBT element is caused to have a positive temperature coefficient in order to reduce current concentration, generally, it is necessary that impurity concentration of a P-type collector layer be lowered so that injection of holes from a lower surface side (collector layer side) is reduced. However, when impurity concentration of the P-type collector layer is lowered, such a problem that an interruptable current value is reduced at the time of short circuit operation occurs.

The present invention has been made to solve the problems as described above, and has an object to provide a semiconductor device that can reduce current concentration on a specific element at the time of parallel connection.

Means to Solve the Problem

A semiconductor device according to the present invention includes: an $N^-$-type drift layer; a P-type well layer formed in a surface layer portion of an upper surface side of the $N^-$-type drift layer; an N-type emitter layer formed in a surface layer portion of the P-type well layer; a gate electrode formed on an upper surface side of a semiconductor layer in which the $N^-$-type drift layer, the P-type well layer, and the N-type emitter layer are formed; an N-type buffer layer formed on a lower surface side of the $N^-$-type drift layer; a P-type collector layer formed on a lower surface side of the N-type buffer layer; and an $N^{++}$-type layer partially formed in the N-type buffer layer, and having impurity concentration being higher than impurity concentration of the N-type buffer layer and being equal to or higher than impurity concentration of the P-type collector layer.

Effects of the Invention

According to the present invention, owing to the $N^{++}$-type layer, the amount of holes to be injected from a lower surface side of the semiconductor device is reduced, and a cross point current value is thereby reduced. Therefore, even if a specific semiconductor device generates heat due to current concentration in a state in which a plurality of semiconductor devices are connected in parallel, a negative feedback is applied to a current flowing through the semiconductor device, and thus breakdown due to current concentration can be less liable to be caused. Further, by setting the impurity concentration of the $N^{++}$-type layer to be equal to or higher than the impurity concentration of the P-type collector layer, even if the implantation amount of impurity at the time of forming the $N^{++}$-type layer varies, an on voltage of the semiconductor device can be stabilized.

These and other objects, features, aspects and advantages of the present invention will become more apparent from the following detailed description of the present invention when taken in conjunction with the accompanying drawings.

BRIEF DESCRIPTION OF DRAWINGS

FIG. 5 is a graph showing a relationship between the cross point current value of the semiconductor device and electric field intensity near a back surface of the semiconductor device at the time of short circuit operation.

DESCRIPTION OF EMBODIMENTS

First Embodiment

Figure 1:
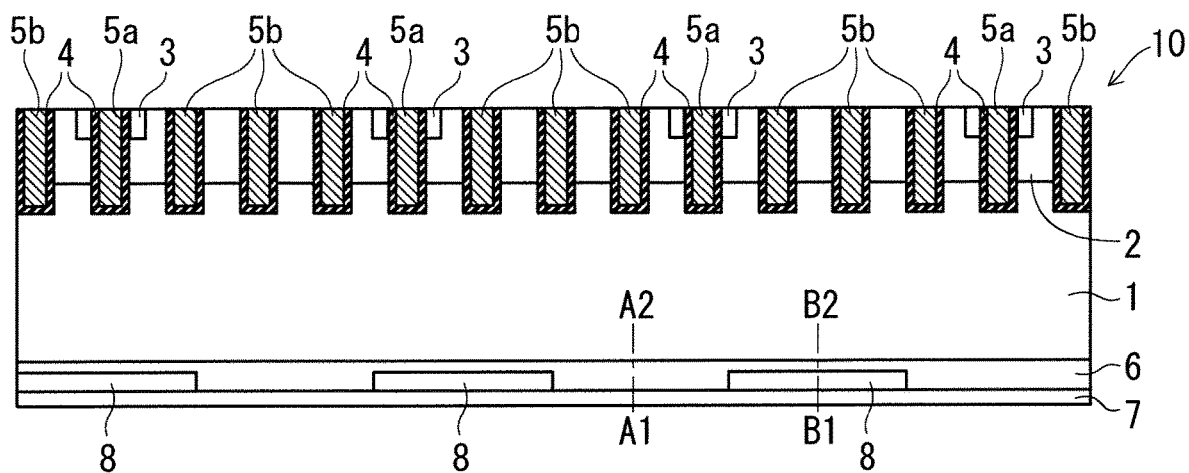
FIG. 1 is a cross-sectional diagram illustrating a structure of a semiconductor device according to a first embodiment.

FIG. 1 is a cross-sectional diagram illustrating a structure of a semiconductor device 10 according to a first embodiment of the present invention. The semiconductor device 10 is a light punch through trench gate IGBT.

The semiconductor device 10 includes an N⁻-type drift layer 1 made of a semiconductor layer such as a silicon substrate, and a P-type well layer 2 is formed in a surface layer portion of the N⁻-type drift layer 1. An N-type emitter layer 3 is partially formed in a surface layer portion of the P-type well layer 2. Here, in the semiconductor layer in which the N⁻-type drift layer 1, the P-type well layer 2, and the N-type emitter layer 3 are formed, a surface of a side on which the P-type well layer 2 and the N-type emitter layer 3 are formed is defined as an "upper surface", and a surface on an opposite side thereof is defined as a "lower surface" or a "back surface".

On an upper surface side of the semiconductor layer in which the N⁻-type drift layer 1, the P-type well layer 2, and the N-type emitter layer 3 are formed, gate electrodes 5a and 5b are formed, interposing a gate insulation film 4. The semiconductor device 10 of this embodiment is a trench gate IGBT. Therefore, a plurality of trenches passing through the P-type well layer 2 are formed in the semiconductor layer, and in each trench, the gate electrode 5a or 5b is formed, interposing the gate insulation film 4. Specifically, the gate electrodes 5a and 5b have depth reaching the N⁻-type drift layer 1 from the upper surface of the P-type well layer 2. On a lower surface side of the N⁻-type drift layer 1, an N-type buffer layer 6 is formed. Further, on a lower surface side of the N-type buffer layer 6, a P-type collector layer 7 is formed.

The gate electrode 5a is formed in a trench passing through the N-type emitter layer 3. Specifically, the gate electrode 5a extends to face each of the N-type emitter layer 3, the P-type well layer 2 below the N-type emitter layer 3, and the N⁻-type drift layer 1 below the P-type well layer 2, interposing the gate insulation film 4. When a voltage of a threshold voltage or more is applied to the gate electrode 5a, a channel for allowing electrical conduction between the N-type emitter layer 3 and the N⁻-type drift layer 1 is formed in the P-type well layer 2 below the N-type emitter layer 3, and an IGBT cell is turned on.

On the other hand, the gate electrode 5b is formed in a trench passing through a portion of the P-type well layer 2 where the N-type emitter layer 3 is absent. Specifically, the gate electrode 5b does not face the N-type emitter layer 3, interposing the gate insulation film 4. Therefore, a cell in which the gate electrode 5b is disposed does not function as an IGBT. Hereinafter, a cell in which the gate electrode 5b is disposed (a cell not including the N-type emitter layer 3) is referred to as a "dummy cell", and the gate electrode 5b is referred to as a "dummy gate electrode".

Here, as an index for quantitatively evaluating positive and negative values of a temperature coefficient of an on voltage of an IGBT element, a "cross point current value" ($I_{CP}$) is defined. The cross point current value is defined as such a current value as to have the same on voltage between room temperature time (for example, 25° C.) and high temperature time (for example, 150° C.).

Figure 2:
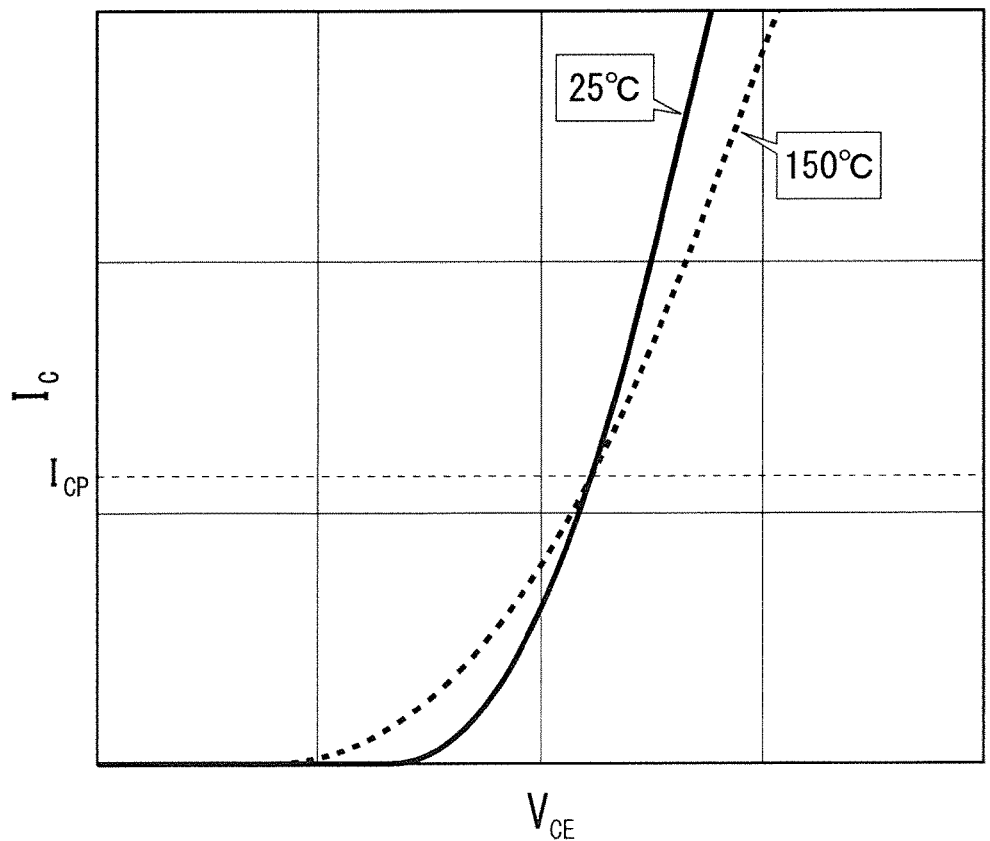
FIG. 2 is a graph for explaining definition of a cross point current value.

FIG. 2 shows a relationship between an on voltage $V_{CE}$ of the IGBT (collector-emitter voltage) and a collector current $I_C$, at the room temperature time (25° C.) and the high temperature time (150° C.). As shown in FIG. 2, when the collector current $I_C$ is equal to the cross point current value $I_{CP}$, the on voltage $V_{CE}$ is the same between the room temperature time and the high temperature time. When the collector current $I_C$ is larger than the cross point current value $I_{CP}$, the on voltage $V_{CE}$ is higher at the high temperature time than at the room temperature time, and when the collector current $I_C$ is smaller than the cross point current value $I_{CP}$, the on voltage $V_{CE}$ is lower at the high temperature time than at the room temperature time.

In this embodiment, the cross point current value of the semiconductor device 10 is set to a value lower than a rated current. In this case, in a state in which a plurality of semiconductor devices 10 are connected in parallel, and when a specific semiconductor device 10 generates heat due to current concentration, a negative feedback is applied to a current flowing through the semiconductor device 10. Therefore, breakdown due to current concentration can be less liable to be caused. The cross point current value can be reduced by reducing holes to be injected from a lower surface side (P-type collector layer 7 side) of the semiconductor device 10.

Next, a formation method of the semiconductor device 10 will be described. First, on an upper surface side of the N⁻-type drift layer 1 made of a silicon substrate or the like, the P-type well layer 2, the N-type emitter layer 3, the gate insulation film 4, the gate electrode 5a, the dummy gate electrode 5b, and the like are formed. The formation technique of these may be the same as that of a known technology, and thus detailed description thereof is omitted.

After that, on a lower surface side of the N⁻-type drift layer 1, for example, phosphorus (P) is ion-implanted, so as to form the N-type buffer layer 6. Subsequently, on a lower surface side of the N-type buffer layer 6, P is additionally implanted with selective ion implantation using the photolithography technology, so as to form an N⁺⁺-type layer 8 in a portion of the N-type buffer layer 6. Further, on a lower surface side of the N⁻-type drift layer 1, for example, boron (B) is ion-implanted, so as to form the P-type collector layer 7.

Acceleration energy in ion implantation of P for forming the N⁺⁺-type layer 8 is set to be lower than acceleration energy in ion implantation of P for forming the N-type buffer layer 6, and higher than acceleration energy in ion implantation of B for forming the P-type collector layer 7. In this manner, the N⁺⁺-type layer 8 is formed near a boundary between the N-type buffer layer 6 and the P-type collector layer 7. Further, an implantation amount (dose amount) of P for forming the N⁺⁺-type layer 8 is set to be equal to or larger than an implantation amount of B for forming the P-type collector layer 7. Specifically, impurity concentration of the N⁺⁺-type layer 8 is set to be equal to or higher than impurity concentration of the P-type collector layer 7.

Figure 3:
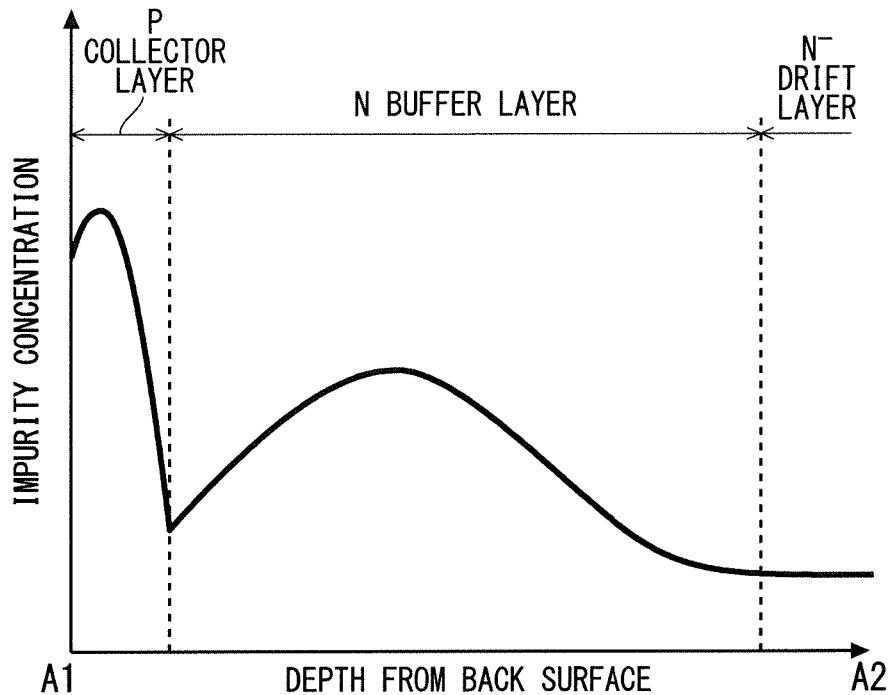
FIG. 3 is a graph showing an example of impurity concentration distribution of the semiconductor device according to the first embodiment.
Figure 4:
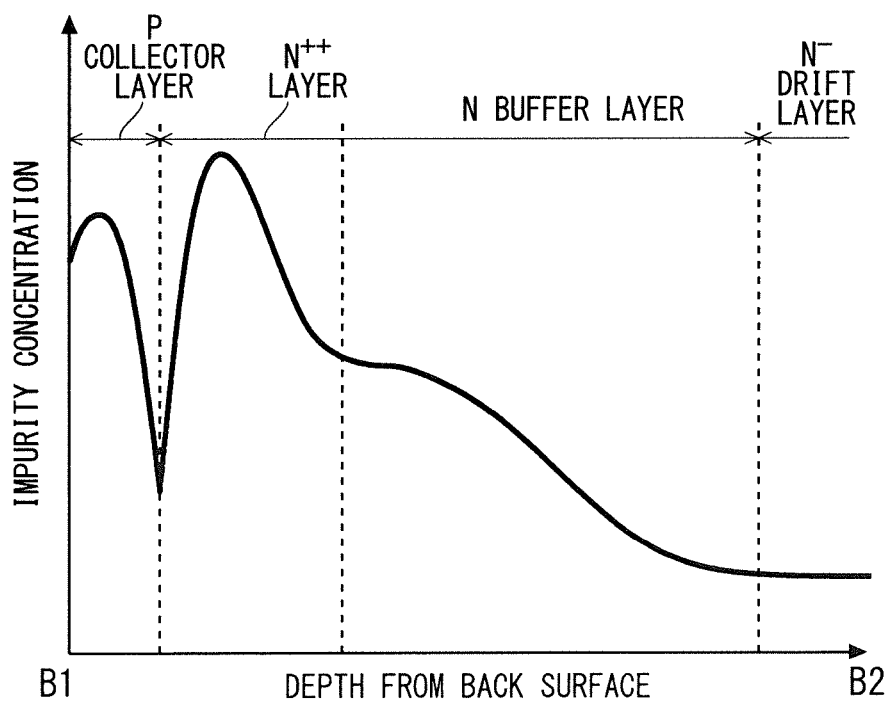
FIG. 4 is a graph showing an example of impurity concentration distribution of the semiconductor device according to the first embodiment.

An example of impurity concentration distribution of the semiconductor device 10 is shown in FIG. 3 and FIG. 4. FIG. 3 shows impurity concentration distribution of a cross-section taken along the line A1-A2 of FIG. 1, i.e., a cross-section of the N⁻-type drift layer 1, the N-type buffer layer 6, and the P-type collector layer 7 in a region where the N⁺⁺-type layer 8 is not formed. FIG. 4 shows impurity concentration distribution of a cross-section taken along the line B1-B2 of FIG. 1, i.e., a cross-section of the N⁻-type drift layer 1, the N-type buffer layer 6, and the P-type collector layer 7 in a region where the N⁺⁺-type layer 8 is formed. In this example, as in FIG. 4, impurity concentration of the N⁺⁺-type layer 8 is set to be higher than impurity concentration of the P-type collector layer 7.

After the N-type buffer layer 6, the P-type collector layer 7, and the N⁺⁺-type layer 8 are formed, activation treatment such as laser anneal is performed on a lower surface side of the N⁻-type drift layer 1, so as to activate the N-type buffer layer 6, the P-type collector layer 7, and the N⁺⁺-type layer 8 layer. As a result, the semiconductor device 10 illustrated in FIG. 1 is obtained.

As in this embodiment, by partially forming the $N^{++}$-type layer 8 in the N-type buffer layer 6, the amount of holes to be injected from the P-type collector layer 7 side at the time of on operation of the semiconductor device 10 is reduced, and thus the cross point current value of the semiconductor device 10 can be lowered. By reducing the cross point current value of the semiconductor device 10 lower than the rated current, even if a specific semiconductor device 10 generates heat due to current concentration when a plurality of semiconductor devices 10 are connected in parallel, a negative feedback is applied to a current flowing through the semiconductor device 10, and thus breakdown due to current concentration is less liable to be caused. Further, imbalance of a chip temperature of the semiconductor device 10 is reduced, and therefore the temperature of the chip at the time of parallel connection is further stabilized. Further, by setting the impurity concentration of the $N^{++}$-type layer 8 to be equal to or higher than the impurity concentration of the P-type collector layer 7, even if the implantation amount of P at the time of forming the $N^{++}$-type layer 8 varies, the on voltage of the semiconductor device 10 can be stabilized.

FIG. 5 is simulation results showing a relationship between the cross point current value (the room temperature is set to 25° C., and the high temperature is set to 150° C.) of the semiconductor device 10 and electric field intensity near a back surface (near the N-type buffer layer 6) of the semiconductor device 10 at the time of short circuit operation at the room temperature. For the sake of comparison, FIG. 5 also shows simulation results of a conventional structure (structure in which the $N^{++}$-type layer 8 is omitted from FIG. 1). When electric field intensity on the back surface side of the semiconductor device 10 is increased, a short circuit current cannot be interrupted, and thus a chip may be broken down. In the semiconductor device 10 according to this embodiment, however, the $N^{++}$-type layer 8 is provided on the back surface side, and thus increase in electric field intensity on the back surface side can be reduced further than the conventional structure, and the cross point current value can be reduced at the same time.

Further, by setting the acceleration energy in ion implantation of P for forming the $N^{++}$-type layer 8 to be higher than the acceleration energy of ion implantation of B for forming the P-type collector layer 7, the P-type collector layer 7 is formed on the entire back surface of the semiconductor device 10. In this manner, connection between the P-type collector layer 7 and a back surface electrode (collector electrode) formed of aluminum (Al), for example, can be an ohmic junction having low resistance, and thus increase in the on voltage can be reduced.

Second Embodiment

Figure 6:
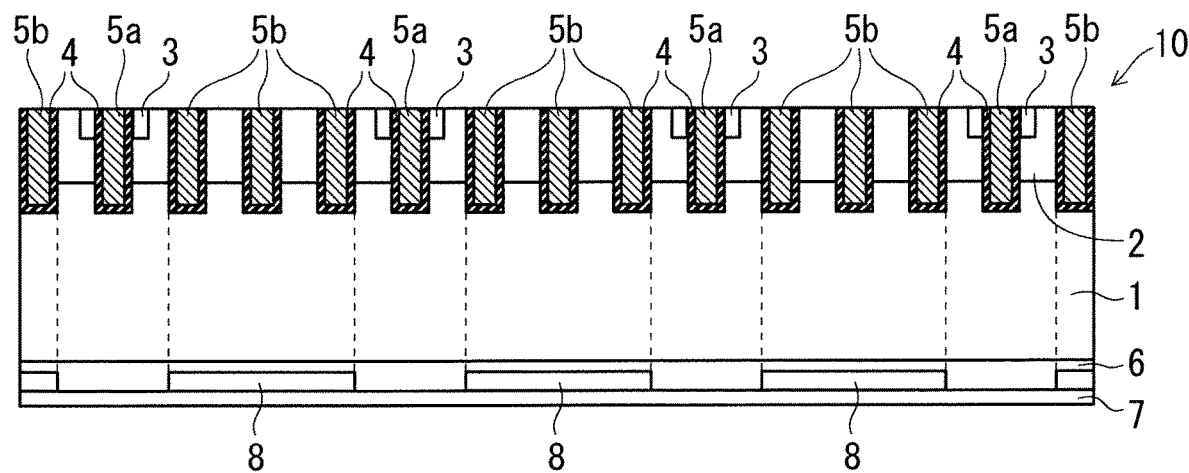
FIG. 6 is a cross-sectional diagram illustrating a structure of a semiconductor device according to a second embodiment.

FIG. 6 is a cross-sectional diagram illustrating a structure of the semiconductor device 10 according to a second embodiment. In FIG. 6, the same elements as those of FIG. 1 are denoted by the same reference signs as FIG. 1.

As illustrated in FIG. 6, in the semiconductor device 10 of the second embodiment, the $N^{++}$-type layer 8 is not formed in the IGBT cell including the N-type emitter layer 3, and is formed only in the dummy cell not including the N-type emitter layer 3 (a cell including the dummy gate electrode 5b). In this manner, the $N^{++}$-type layer 8 is disposed to avoid a region immediately below the N-type emitter layer 3.

At the time of the on operation of the semiconductor device 10, there is more electron current in a region immediately below the N-type emitter layer 3. However, by disposing the $N^{++}$-type layer 8 to avoid a region immediately below the N-type emitter layer 3, electric field intensity near the back surface at the time of the short circuit operation of the semiconductor device 10 is reduced. In this manner, an effect that an interruptable current at the time of short circuit operation of the semiconductor device 10 is increased can be obtained.

In FIG. 6, the $N^{++}$-type layer 8 is formed only in the dummy cell. However, the $N^{++}$-type layer 8 may extend to the outside of the dummy cell, to the extent that the $N^{++}$-type layer 8 does not reach a region immediately below the N-type emitter layer 3.

Further, in the above description, silicon is given as an example of a material of the $N^-$-type drift layer 1, but this is not restrictive. For example, a material of the $N^-$-type drift layer 1 may be a wide-bandgap semiconductor such as silicon carbide, a gallium nitride-based material, and diamond.

Figure 7:
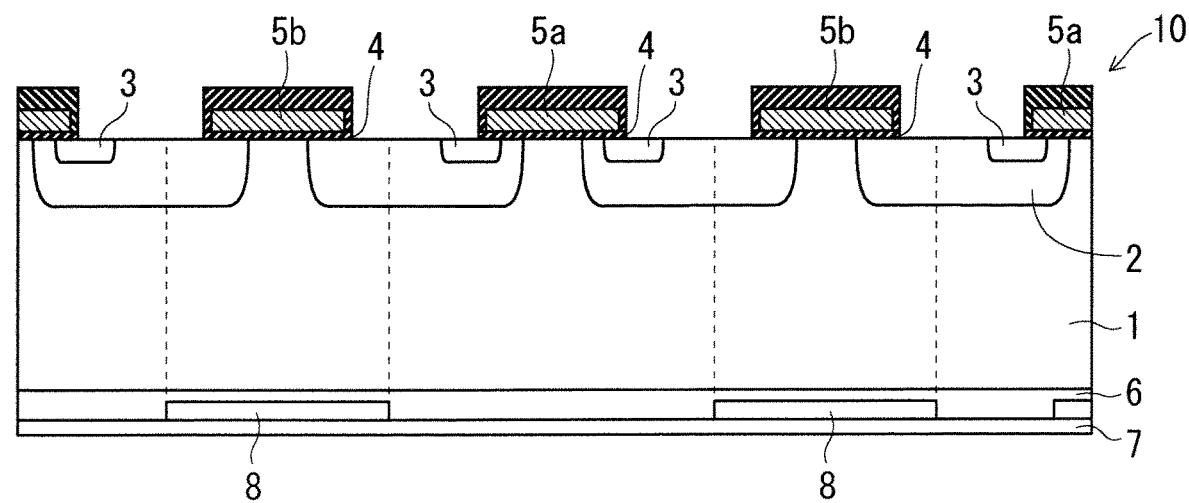
FIG. 7 is a cross-sectional diagram illustrating a configuration of a case where the present invention is applied to a planar gate IGBT.

Further, in FIG. 1 and FIG. 6, an example in which the present invention is applied to a trench gate IGBT is illustrated. However, the present invention is not limited to being applied to a trench gate IGBT, and can also be applied to a planar gate IGBT. For example, a configuration of a case where the above second embodiment is applied to a planar gate IGBT is illustrated in FIG. 7. Specifically, in FIG. 7, the $N^{++}$-type layer 8 is not formed in the IGBT cell including the N-type emitter layer 3, and is formed only in the dummy cell not including the N-type emitter layer 3 (a cell including the dummy gate electrode 5b). Note that, in FIG. 7, the same elements as those of FIG. 6 are denoted by the same reference signs as FIG. 6.

In FIG. 7, the gate electrode 5a and the dummy gate electrode 5b are formed in a planar manner on an upper surface of the semiconductor layer in which the $N^-$-type drift layer 1, the P-type well layer 2, and the N-type emitter layer 3 are formed. The gate electrode 5a among those extends to face each of the N-type emitter layer 3, the P-type well layer 2 adjacent to the N-type emitter layer 3, and the $N^-$-type drift layer 1 adjacent to the P-type well layer 2, interposing the gate insulation film 4. On the other hand, the dummy gate electrode 5b is formed over portions of the P-type well layer 2 where the N-type emitter layer 3 is absent, and the N-type drift layer 1 adjacent to these portions. Specifically, the dummy gate electrode 5b does not face the N-type emitter layer 3, interposing the gate insulation film 4.

Generally, the trench gate IGBT has advantages in a high degree of integration, and the potential of high current density. However, the planar gate IGBT may be used for the reason that a package size of the semiconductor device has a space, or heat dissipation performance of a chip is emphasized more than high integration, for example. Also when the present invention is applied to a planar gate IGBT, effects similar to those of a case where the present invention is applied to a trench gate IGBT can be obtained.

In FIG. 7, an example in which the second embodiment is applied to a planar gate IGBT is illustrated. However, as a matter of course, the first embodiment can also be applied to a planar gate IGBT, Specifically, when the present invention is applied to a planar gate IGBT, a part of the $N^{++}$-type layer 8 may be formed in the IGBT cell including the N-type emitter layer 3.

Note that, in the present invention, each embodiment can be freely combined with each other, and each embodiment can be modified or omitted as appropriate, within the scope of the invention.

While the invention has been shown and described in detail, the foregoing description is in all aspects illustrative and not restrictive. It is therefore understood that numerous modifications and variations can be devised without departing from the scope of the invention.

EXPLANATION OF REFERENCE SIGNS 10 semiconductor device, 1 N$^-$-type drift layer, 2 P-type well layer, 3 N-type emitter layer, 4 gate insulation film, 5a gate electrode, 5b dummy gate electrode, 6 N-type buffer layer, 7 P-type collector layer, 8 N$^{++}$-type layer.

The invention claimed is:

1. A semiconductor device comprising:
an N$^-$-type drift layer;
a P-type well layer formed in a surface layer portion of an upper surface side of the N$^-$-type drift layer;
an N-type emitter layer formed in a surface layer portion of the P-type well layer;
a gate electrode formed on an upper surface side of a semiconductor layer in which the N$^-$-type drift layer, the P-type well layer, and the N-type emitter layer are formed;
an N-type buffer layer formed on a lower surface side of the N$^-$-type drift layer;
a P-type collector layer formed on a lower surface side of the N-type buffer layer; and
an N$^{++}$-type layer formed within the N-type buffer layer such that the P-type collector layer underlies an entirety of the N$^{++}$-type layer, wherein
the N$^{++}$-type layer has a maximum impurity concentration higher than a maximum impurity concentration of the N-type buffer layer and higher than a maximum impurity concentration of the P-type collector layer.

2. The semiconductor device according to claim 1, wherein
the N$^{++}$-type layer is disposed to avoid a region immediately below the N-type emitter layer.

3. The semiconductor device according to claim 1, wherein
the semiconductor device includes
a cell including the N-type emitter layer facing the gate electrode, interposing an insulation film, and
a dummy cell not including the N-type emitter layer facing the gate electrode, interposing an insulation film, and
the N$^{++}$-type layer is formed only in the dummy cell.

* * * * *